United States Patent [19]
Kimura et al.

[11] Patent Number: 6,025,620
[45] Date of Patent: Feb. 15, 2000

[54] SEMICONDUCTOR DEVICE AND METHOD OF PRODUCING THE SAME

[75] Inventors: Masatoshi Kimura; Hiroaki Sekikawa; Kaoru Motonami; Atsushi Amo, all of Tokyo, Japan

[73] Assignee: Mitsubishi Denki Kabushiki Kaisha, Tokyo, Japan

[21] Appl. No.: 09/053,533

[22] Filed: Apr. 2, 1998

[30] Foreign Application Priority Data

Sep. 25, 1997 [JP] Japan ................................ 9-260133

[51] Int. Cl.[7] .................................................. H01L 29/72
[52] U.S. Cl. .......................... 257/296; 257/303; 257/306; 257/382; 257/384; 438/239; 438/244; 438/253; 438/655; 438/694
[58] Field of Search ..................... 257/296, 303, 257/306, 382, 384; 438/239, 244, 253, 655, 694

[56] References Cited

U.S. PATENT DOCUMENTS 5,939,746  8/1999  Koyama et al. .................. 257/308

FOREIGN PATENT DOCUMENTS 5-259115  10/1993  Japan .
8-321591  12/1996  Japan .
9-64294   3/1997   Japan .

OTHER PUBLICATIONS

C.Y. Ting, et al., "The Use of TISI$_2$ for Self Aligned Silicide (Salicide) Technology", V–MIC Conf. Proceeding, Jun. 25–26, 1985, pp. 307–318.

Neil H.E. Weste, et al., "Principles of CMOS VLSI Design–A Systems Perspective", (Second Edition), Chapter 8, Subsystem Design, pp. 562–567.

Primary Examiner—Edward Wojciechowicz
Attorney, Agent, or Firm—Oblon, Spivak, McClelland, Maier & Neustadt, P.C.

[57] ABSTRACT

In a semiconductor device having a DRAM memo cell and a peripheral circuit, source/drain regions of transistors composing the memory cell are not silicided to restrict a junction leak and to improve a refresh characteristic; surfaces of source/drain regions and gate electrodes of transistors composing the peripheral circuit are silicided to reduce resistance of contacts and resistance of wirings for enabling a high-speed operation; side walls made of insulating material are formed on sides of the gate electrodes of the transistor composing the peripheral circuit to serve as a mask when impurities are injected for forming the source/drain regions; and insulating material laminated in the memory cell serves as a mask against siliciding.

11 Claims, 10 Drawing Sheets

31: $Ti_{x_1}Si_{y_1}N_{z_1}$ (Nrich)   33: $TiSi_2$

32: $Ti_{x_2}Si_{y_2}N_{z_2}$ (Sirich)

SEMICONDUCTOR DEVICE AND METHOD OF PRODUCING THE SAME

BACKGROUND OF THE INVENTION

1. Field of the Invention

The present invention relates to a semiconductor device having structure that silicide layers of refractory metal or these of near-noble metal are selectively formed in surfaces of a diffusion layer and a gate electrode, a surface of capacitor electrode or the like, and to the method of producing the same.

2. Discussion of Background

FIG. 13 is a principal portion of semiconductor device in section made by a self aligned silicidation (SALICIDE) process according to a literature (Jun. 25–26, 1985 V-MIC Conf Proceeding). In the Figure, numeral 101 designates a semiconductor substrate; numeral 102 designates separation oxide films; numeral 103 designates a gate insulating film which is laminated on the-surface of the semiconductor substrate 101; numeral 104 designates a gate electrode laminated on the gate insulating film; numeral 105 designates a silicide layer formed by siliciding the surface of the gate electrode 104; numeral 106 designates source/drain regions made of a region including high concentration impurities and formed at both sides of the gate electrode 104 interposing a channel region positioned under the gate electrode 104; numeral 107 designates silicide layers formed by siliciding the surface of the source/drain regions 106; numeral 108 designates sidewalls formed by depositing on sides of the gate electrode 104 including sides of the silicide layer 105; numeral 109 designates insulating films laminated on an element including the gate electrode surface; numeral 110 designates bit wire contacts formed in the insulating layers 109 so as to contact surfaces of the source/drain regions 106.

In the semiconductor device as shown in FIG. 13, it was possible to obtain low resistance by siliciding the surface of gate electrode 104 and the surfaces of source/drain regions 106.

In the next, a flow of processing the semiconductor device of FIG. 13 is described with reference to FIGS. 14a through 14d. As shown in FIG. 14a, the separation oxide film 102 was formed on non-active areas in the surface of semiconductor substrate 101. Further, the gate electrode 104 was patterned in said surface after the gate insulating film 103 was formed. The source/drain regions 106 were formed by implanting impurities into the semiconductor substrate 101.

As shown in FIG. 14b, an oxide film such as TEOS was laminated on the whole surface of semiconductor substrate 101; and said whole surface was etched back, whereby the sidewalls 108 deposited on sides of the gate electrode 104 could selectively be leaved.

As shown in FIG. 14c, a refractory metal such as Ti or a near-noble metal 105a such as cobalt was laminated and the surfaces of source/drain regions 106 were silicided to obtain the silicide layers 105 and 107. At this time, in a surface layer, unreacted refractory metal or unreacted near-noble metal 105a was left.

Thereafter, as shown in FIG. 14d, the unreacted refractory metal or the unreacted near-noble metal 105 was taken off by liquid remover such as $H_2SO_4$ and $H_2O_2$. By providing the insulating film 109 and the bit wire contacts 110, it was possible to obtain the semiconductor device as shown in FIG. 13.

However, in general, when the silicide layers 107 were formed, the silicide layers 107 extended in a spike-like form to a PN junction between the source/drain regions 106 and the well, whereby it was known that there was a drawback that the leak current in the junction such as a field edge is large.

Therefore, although there was a merit that resistances of the diffusion layer and the gate electrodes could be small by the formation of silicide layers, it was not applicable to device sensitive to a junction leak, for example DRAM.

Another conventional technique disclosed in Japanese unexamined patent publication No. Hei. 5-259115 (JP-A-5259115) discloses a semiconductor device in which upper portions of gate electrodes and these of source/drain regions were selectively silicided for a first regions of device having transistor elements and no silicidation was provided in a second region of device having a high-resistance element including a region of impurities. There was also disclosed that a mask of $SiO_2$ film is selectively formed on the second region of device so as not to silicide the second region of device.

On the other hand, a logic process consolidating DRAM was focused on in recent years, wherein a logic process for making a high-speed microprocessor and a DRAM are combined. This is a process for realizing both a high degree of integration of memory and a transistor having a high logic process in a chip.

In devices concerning multi-media which is recently paid attention to, a lage-sized memory and a high performance transistor for realizing a high-speed operation are necessary in order to perform operations of graphics. Also, the logic processing unit consolidating DRAM is necessary.

In the high-speed logic process, not only the high performance transistor but also resistances of a gate electrode and a diffusion layer such as a source/drain region had a great influence to delay, wherein the high-speed was obtainable by introducing the siliciding process.

However, in the logic process consolidating DRAM described as the convention technique, there were problems that failure in refreshing could be derived from by the junction leak concerning the siliciding process and, therefore, such a process was difficult to use.

SUMMARY OF THE INVENTION

The present invention is to solve the above-mentioned problems inherent in the prior art and to provide a technology necessary for siliciding process which is positively used in a DRAM.

According to a first aspect of the present invention, there is provided a semiconductor device comprising a DRAM memory cell region and one of a peripheral circuit region and a logical circuit region including said peripheral circuit region, wherein a first MOS transistor in said peripheral circuit region or said logical circuit region has silicide layers on a first gate electrode and on first source/drain regions, sidewalls are formed by depositing on sides of the first gate electrode, and the same material as that composing said sidewalls is laminated on the surfaces of a second gate electrode and second source/drain regions of a second MOS transistor, which constitutes a memory cell in said DRAM memory cell region.

According to a second aspect of the present invention, there is provided a semiconductor device including a DRAM memory cell characterized by silicide layers are provided on surfaces of gate electrodes of transistors composing said DRAM memory cell and on a surface of source/drain region in contact with a bit wire contact.

According to a third aspect of the present invention, there is provided a semiconductor device according to the second aspect of the invention, wherein a storage node contact is connected to a source/drain region other than said source/drain region in the second aspect of said transistor composing said DRAM memory cell, and a silicide layer is selectively formed in a portion connecting a surface of the other source/drain region to said storage node.

According to a fourth aspect of the present invention, there is provided a semiconductor device comprising a region of impurities of a first conductive type, formed on a surface region of a semiconductor substrate, and a contact made of semiconductor materials including impurities of a second conductive type and connected to said region of impurities of the first conductive type interposing silicide layer, wherein said silicide layer has a multi-layer structure formed of at least a first silicide layer, including a nitrogen atoms and in contact with said contact, and a second silicide layer positioned in the lower of said first silicide layer, and the concentration of nitrogen at a portion in said first silicide layer is high as the portion is close to said contact, and the concentration low as the portion is close to said second silicide layer.

According to a fifth aspect of the present invention, there is provided a semiconductor device according to the fourth aspect of the invention, wherein the region of impurities of the first conductive type is a first source/drain region of a first transistor constituting a peripheral circuit, and said first source/drain region is electrically connected to the region of impurities of the second conductive type, which is a second source/drain region of a second transistor constituting a memory cell region interposing the silicide layer and the contact.

According to a sixth aspect of the present invention, there is provided a semiconductor device according to the second aspect or the third aspect of the invention, wherein the region of DRAM memory cell is constituted of a first region composed of the memory cell having silicide layers at least at a portion thereof and a second region composed of memory cells without any silicide layer.

According to a seventh aspect of the present invention, there is provided a semiconductor device comprising a MOS transistor formed in a region of DRAM memory cell in the semiconductor substrate, storage nodes electrically connected to one of source/drain regions in said MOS transistor, a cell plate laminated on a surface of said storage nodes interposing a dielectric film, a silicide layer laminated on the surface of said cell plate, and wiring of an upper layer formed on said silicide layer interposing an inter-layer insulating film.

According to an eighth aspect of the present invention, there is provided a semiconductor device according to the seventh aspect of the invention, wherein the wiring of an upper layer is electrically connected to the silicide layer interposing a contact formed in the inter-layer insulating film.

According to a ninth aspect of the present invention, there is provided a method of producing a semiconductor device comprising: a step of forming gate electrodes interposing a gate electrode respectively on a surface of a first region and a surface of a second region in a semiconductor substrate; a step of forming regions having low concentration impurities respectively at the both sides of channel regions positioned below said gate electrodes; a step of laminating a insulating material at least on said first region and said second region; a step of forming an etching mask on said first region; a step of forming regions having high concentration impurities by performing anisotropic etching to said second region for forming side walls made of said insulating material and deposited on sides of the gate electrode and implanting impurities into said region having low concentration impurities positioned in said second region; a step of removing said etching mask; a step of laminating a film of refractory metal or a film of near-noble metal at least on said second region; a step of forming silicide layers on faces at which said film of refractory metal or said film of near-metal is in contact with, said gate electrode in the second region and the source/drain region; a step of removing a portion of said film of refractory metal or said film of near-noble metal which were unreacted, wherein said first region is a DRAM region, and said second region is a peripheral circuit region or a logic circuit region including said peripheral circuit region.

According to a tenth aspect of the present invention, there is provided a method of producing a semiconductor device comprising: a step of forming regions of impurities of a first conductive type, a step of forming silicide layers on a face, at which said regions of impurities of the first conductive type and a film of refractory metal or a film of near-noble metal are in contact, by laminating said film of refractory metal or said film of near-noble mental is laminated on said regions of impurities of the first conductive type and providing a heat treatment to silicide; a step of removing a portion of the film of refractory metal or the film of near-noble metal which was unreacted; a step of implanting nitrogen into said silicide layers and providing a heat treatment; a step of forming a contact of a second conductive type which is in contact with said silicide layer, wherein said silicide layers have a multi-layer structure including at least a first silicide layer including nitrogen atoms and in contact with said contact, and a second silicide layer positioned below said first silicide layer, and the concentration of nitrogen at a portion in said first silicide layer is high as the portion is close to said contact and the concentration is low as the portion is close to said second silicide layer.

BRIEF DESCRIPTION OF THE DRAWINGS

A more complete appreciation of the invention and many of the attendant advantages thereof will be readily obtained as the same becomes better understood by reference to the following detailed description when considered in connection with accompanying drawings, wherein.

DETAILED DESCRIPTION OF THE PREFERRED EMBODIMENTS

Detail explanation will be given of preferred embodiments of the present invention in reference to FIGS. 1 through 12 as follows, wherein the same numeral references are used for the same or the similar portions and description of these portions is omitted.

EXAMPLE 1

Figure 1:
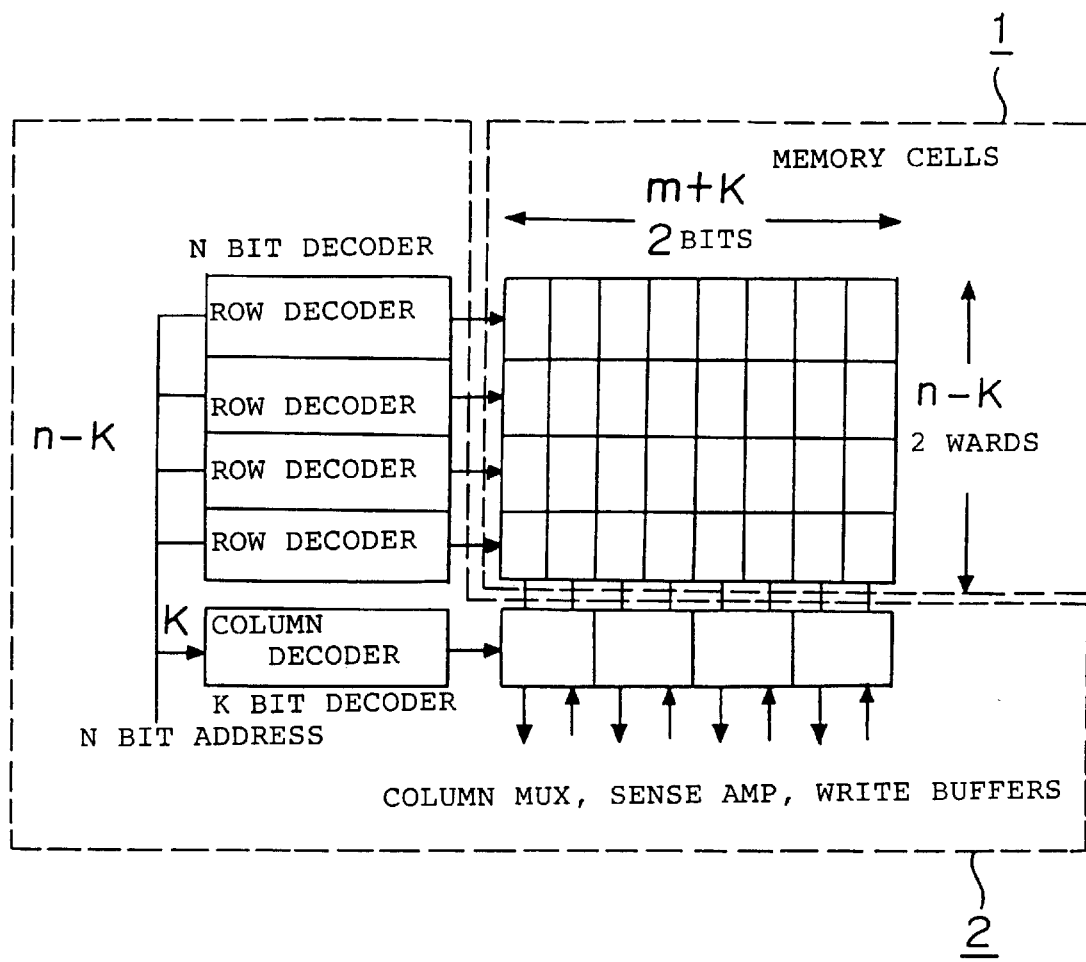
FIG. 1 is a plan view for schematically showing a semiconductor device of Example 1 of the present invention.

FIG. 1 shows Example 1 of the present invention, wherein a chip architecture of DRAM is shown. In the Figure, numeral 1 designates a memory cell array of DRAM, namely an non-silicide region which is not silicided; numeral 2 designates a peripheral circuit, namely a silicide region in which surfaces of gates and surfaces of active regions are silicided.

In Example 1, a portion where a junction leak caused by such as a defective refresh is strictly avoided, for example, a memory cell composed of the finest elements, is not silicided. In the region of peripheral circuit, surfaces of gate electrodes, surfaces of diffusion layers, such as source/drain regions or the like, are selectively silicided in order to attain a high-speed operation.

According to the semiconductor device having the structure as shown in FIG. 1, decrement of resistance of wiring and decrement of resistance of contact in the peripheral circuit, which are merits of siliciding, are obtainable while the memory cell is similar to that of the non-silicided DRAM.

Figure 2:
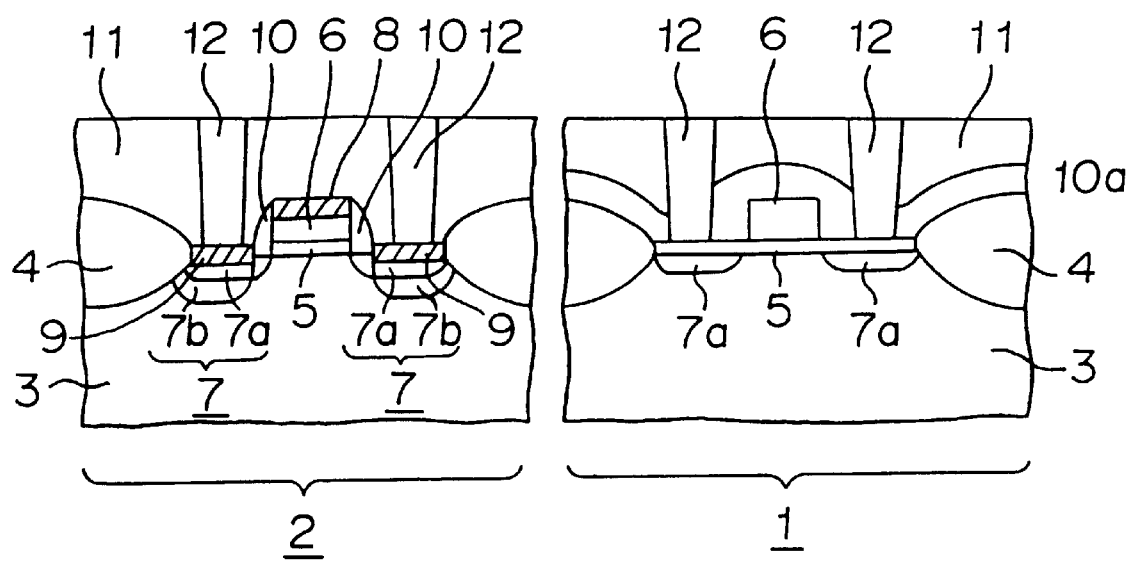
FIG. 2 is a side view of important portions in cross-section of the semiconductor device for schematically showing Example 1 of present invention.

FIG. 2 is a cross-sectional view of elements (MOS transistors) which are formed in the silicide region and the non-silicide region respectively in the present invention. In FIG. 2, numeral 3 designates a semiconductor substrate; numeral 4 designate separation oxide films formed in an inactive region of the surface of semiconductor substrate 3; numeral 5 designates gate insulating films formed in an active region of the semiconductor substrate 3; numeral 6 designates gate electrodes patterned in the surface of gate insulating film 5; numeral 7 designate source/drain regions composed of regions having low concentration impurities 7a and regions having high concentration impurities 7b interposing a channel region position below the gate electrode 6; numerals 8 and 9 are silicide layers formed by siliciding the surface of gate electrode 6 and the surfaces of source/drain regions 7 in the silicide layer 2; numeral 10 designates sidewalls formed by depositing on sides of the gate electrode 6 in the silicide region; numeral 10a is a TEOS oxide film laminated in the non-silicide region 1, wherein the film is made of the same material as that composing the side walls 10; numeral 11 designates inter-layer insulating films; and numeral 12 designates contacts formed in the inter-layer insulating films 11 for electrically connecting the source/drain regions 7, including the regions having low concentration impurities 7a provided in the non-silicide region 1, of respective transistors to wirings (not shown) in upper layers.

For example, in the semiconductor device as shown in FIG. 2, low resistance of the gate electrode, namely low resistance of a word line, and low resistance between the source/drain regions 7 and the contacts 12 formed so as to be in contact with the source/drain regions 7 are obtainable for a transistor elements composing the logic circuit region, including the peripheral circuit region, which is the silicide region 2. On the other hand, in the DRAM memory cell region, which is the non-silicide region 1, a junction leak can be avoided by restricting the siliciding. Because any side wall is not formed in sides of gate electrode 6 composing of transistor element in the non-silicide region 1, the surface of semiconductor substrate 3 is damaged a little by an etching.

Figure 3A:
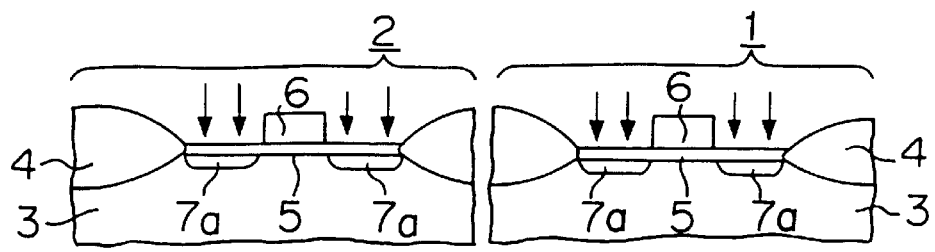
FIG. 3a through 3e are flow diagrams of production for schematically showing a cross-sectional view of the semiconductor device in Example 1 of the present invention.

In the next, a method of producing the semiconductor device having the non-silicide region and the silicide region as shown in FIG. 2 is described. As shown in FIG. 3a, separation oxide films 4 are selectively formed on the non-active areas of the semiconductor substrate 3, and gate oxide layers 5 are formed on the surfaces of activation regions. Thereafter, the gate electrodes 6 are patterned on the gate oxide films 5 of the activation regions, wherein the gate electrodes will be the wiring (word line). Said gate electrodes 6 are made of polysilicone. Then, by implanting impurities, regions having low concentration impurities 7a are formed interposing channel regions positioned below the gate electrode 6. The impurities is n-type when the surface of semiconductor substrate 3 is a p-well.

Figure 3B:
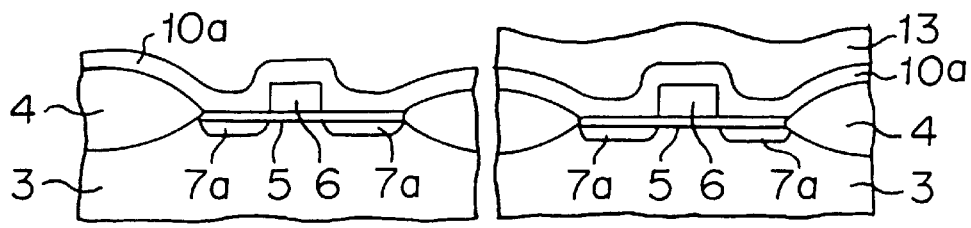

Further, as shown in FIG. 3b, a TEOS oxide film 10a is laminated on the whole surface of the non-silicide region 1 and the silicide region 2. Said TEOS oxide film 10a will be side walls deposited on sides of the gate electrode 6 in the silicide region 2, which also-serves as a mask at the time of siliciding in the non-silicide region 1. Then a resist mask 13 is formed in the non-silicide region 1.

Figure 3C:
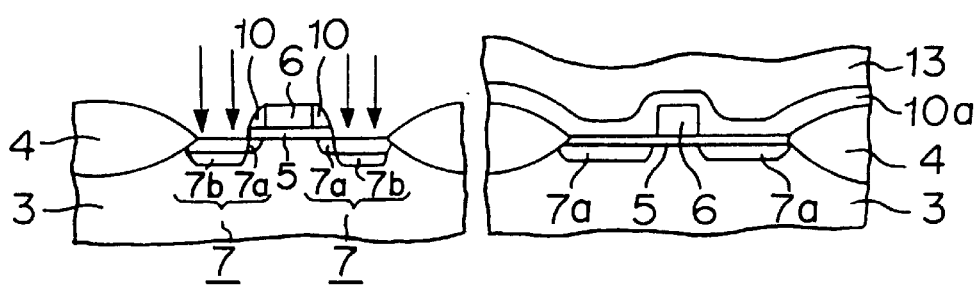

Further, as shown in FIG. 3c, a part of the TEOS oxide film 10a placed in the silicide region 2 is subject to an anisotropic etching using the resist mask 13 as an etching mask, whereby the side walls 10 are formed by the deposition on sides of the gate electrode 6. Then, impurities are implanted into the silicide region 2 to form regions having high concentration impurities 7b, wherein n-type source/drain regions 7 of a lightly doped drain (LDD) structure composed of the regions having low concentration impurities 7a and the regions having high concentration impurities 7b are obtainable.

Figure 3D:
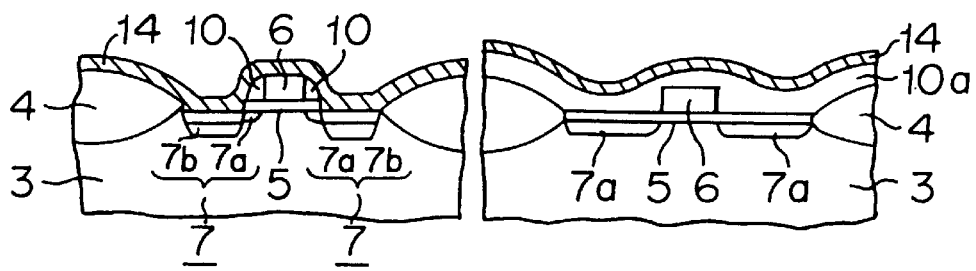

Further, as shown in FIG. 3d, after the resist mask 13 is removed, the non-silicide layer 1 and the silicide layer 2 are subject to annealing in order to recover damage caused by implanting ions. Then, a refractory metal or a near-noble metal 14 is laminated on both of the layers.

Figure 3E:
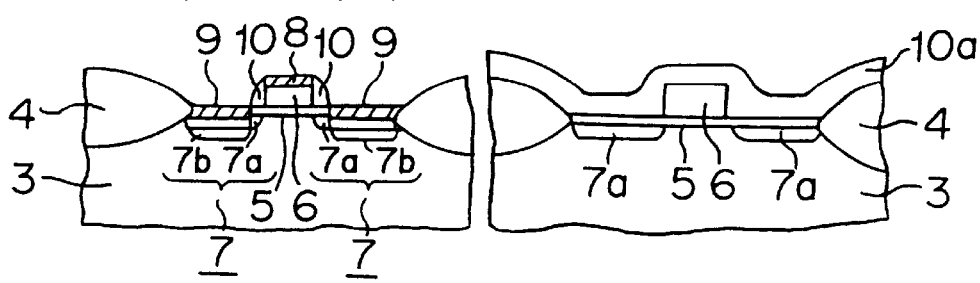
Figure 4:
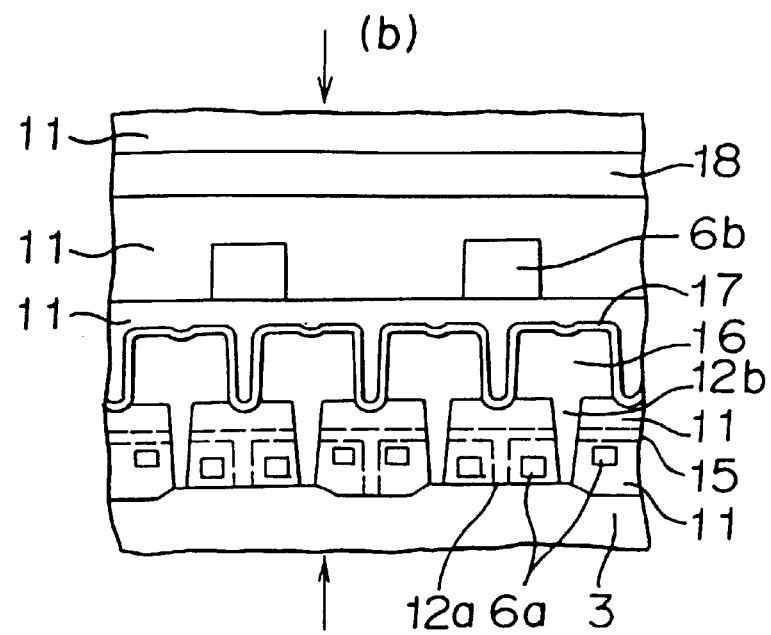
FIG. 4a is a side view of an important portion in cross-section of a semiconductor device for schematically showing Example 2 of the present invention.
FIG. 4b is a side view of an important portion in cross-section of the semiconductor device for schematically showing Example 2 of the present invention.
Figure 4:
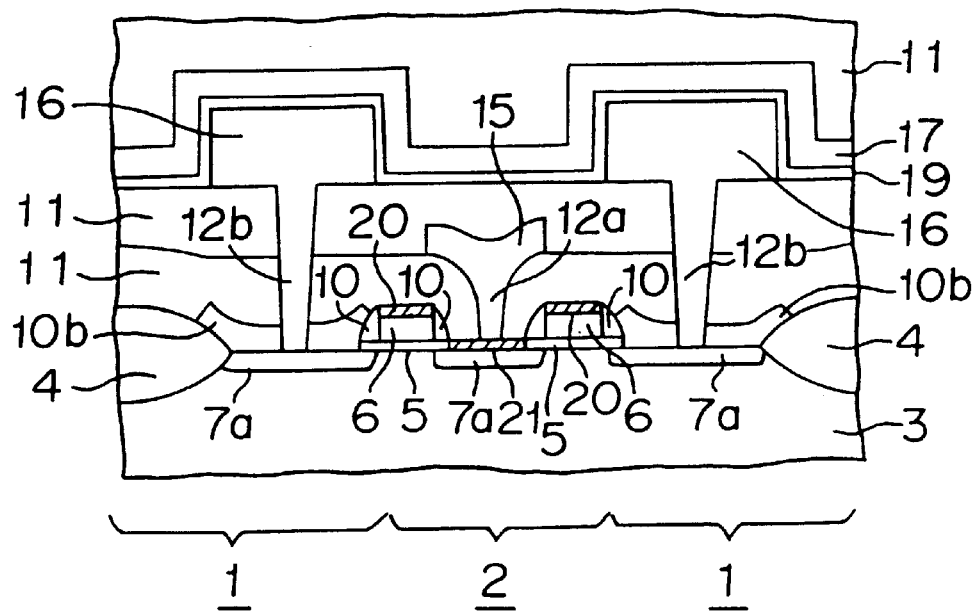

Further, as shown in FIG. 3e, in the silicide region 2, said metal is heated by a rapid thermal annealing (RTA) to form silicides 8, 9 on the surface of gate electrode 6 and the surfaces of source/drain regions 7. Then a part of the refractory metal or the near-noble metal 14 which are unreacted in taken off by a liquid remover, for example, including $H_2SO_4$ and $H_2O_2$.

Further, by forming an inter-layer insulating film 11 and contacts 12 for connecting to wirings of an upper layer respectively, it is possible to obtain the semiconductor device shown in FIG. 2. However, Example 1 of the present invention is not to limited to the semiconductor device shown in FIG. 2 and it is needless to say that the semiconductor device can have different structure such as arrangement of the contact 12 and the surface shape of inter-layer insulating film 11 depending on a requisite semiconductor device.

In so formed semiconductor device, damage to the surface of semiconductor substrate 3 is smaller than that to a conventional technique, in which side walls are formed on sides of gate electrodes in the whole regions, because any side wall is not formed on sides of gate electrodes 6 in the non-silicide region 1 and side walls 10 are formed on sides of gate electrodes 6 in the silicide region 2. Also it is possible to omit a step of forming a TEOS oxide film, which will be a side mask, in the siliciding process, whereby the number of steps can be reduced.

As mentioned in the above, according to Example 1 of the present invention, it is possible to obtain the semiconductor device which realizes good circuit operation without a junction leak in the non-silicide region 1 and high-speed operation by low resistance of wirings and low resistance of contacts, resulted from the silicides 8, 9 and so on formed in the silicide region 2, because the memory cells are in the non-silicide region 1 and the peripheral circuit region other than the memory cells or the peripheral region including a logic circuit in case of a logic process consolidating type semiconductor device is in the silicide region 2.

EXAMPLE 2

Example 2 of the present invention is described. FIGS. 4a and 4b show a structure of memory cell region of semiconductor device in cross-section, specifically, are a cross-sectional view of a DRAM memory cell having a capacitor having structure of stacking thick films. FIG. 4a is a cross-sectional view of a capacitor having a common structure of stacking thick films taken along a direction to which bit wires 15 extend, which correspond to a figure shown in NIKKEI MICRO DEVICE Vol. January 1993, p.31.

In FIG. 4a, numeral 6a designates sub ward wires; numeral 6b designates main word wires; numeral 15 designates a bit wire; numeral 12a designates bit wire contacts for connecting the bit wire 15 to the activation region formed on the surface of semiconductor substrate 3; numeral 12b is storage node contacts for connecting storage node 16 of structure of stacking thick films to activation regions formed on the surface of semiconductor substrate 3. On surfaces of the storage nodes contacts 16, a cell plate 17 is formed interposing a dielectric film so as to constitute capacitors. On the capacitors, the main word wires 6b are arranged interposing an interlayer insulating film 11. Further, column selection lines 18 made of aluminum are formed in the upper layer thereof.

FIG. 4b shows features of Example 2 of the present invention, wherein a cross-section taken along a direction of FIG. 4a to which the sub word wires 6a and the main word wires 6b extend, wherein the Figure is obtained by rotating FIG. 4a by 90°. In this cross-sectional view, two representative memory cells are shown. In FIG. 4b, numeral 19 designates a dielectric film provided between the storage nodes 16 and the cell plate 17, which film is an element constituting a capacitor; numeral 10b designates TEOS oxide films laminated on regions having low concentration impurities 7a in a non-silicide region 1. Numerals 20 and 21 designate silicide layers which are formed selectively on the surfaces of gate electrodes 6 of transistors composing the memory cell and surfaces of regions having low concentration impurities 7a, which will be source/drain regions. The sub word wires 6a in FIG. 4a correspond to the gate electrodes 6 in FIG. 4b.

The above Example 1 has characteristics that the memory cell region in a chip is the non-silicide region 1 and the region other than the memory cell region is the silicide region 2. However, in Example 2, both of the non-silicide region and the silicide region are formed on a memory cell region. Specifically, the surfaces of regions having low concentration impurities 7a, to which the storage node contacts 12b are connected, are the non-silicide region 1, and the surface of region having low concentration impurities 7a, to which the bit wire contact 12a is connected, and the surface of gate electrodes 6 are the silicide region 2 with the silicide layers 20 and 21 respectively.

In the next, a method of producing the semiconductor device shown in FIGS. 4a and 4b is described.

At first, the gate electrodes and the source/drain regions (the regions having low concentration impurities 7a in the memory cell region) and so on constituting the transistor elements are formed on the semiconductor substrate. The side walls 10 are formed on sides of the gate electrodes 6. A mask in a siliciding process, for example TEOS oxide films 10b, is patterned on areas where the regions having low concentration impurities 7a, with which the storage node contacts 12b are in contact, are formed in the memory cell region. At this time, in the region other than the memory cell region, the mask of TEOS oxide films 10b is not formed on areas where a high-speed operation is necessary so that the siliciding is simultaneously possible, and the TEOS oxide films 10b are selectively formed on areas where the siliciding is unnecessary.

After the TEOS oxide films 10b are patterned, a refractory metal or a near-noble metal is laminated and a RTA is provided for siliciding. Thereafter, a part of the refractory metal or a part of the near-noble metal, which were unreacted, is removed. Then, an inter-layer insulating film 11 is laminated, and the bit wire 15 is patterned so that the bit wire contact 12a is in contact with the silicide layer 21. Further, the storage nodes 16 of thick film type are formed so that the storage node contacts 12b are is in contact with the regions having low concentration impurities 7a on which silicide layers are not formed. Then, the dielectric film 19 and the cell plate 17 are successively formed to obtain the semiconductor device having the structure shown in FIG. 4b. Description of steps of producing the main word wires 6b and the column selection line 18 shown in FIG. 4a is omitted.

In so constituted semiconductor device, the surfaces of gate electrodes 6 of the switching transistors composing the DRAM memory cell and the surfaces of source/drain regions (regions having low concentration impurities 7a), with which the bit wire contacts 12 are in contact, are selectively silicided to form the silicide layers 20 and 21 in the memory cell region having a difficult controllability, thereby resistance of wirings and resistance of contacts are decreased and a high-speed reading and a high-speed writing are obtainable.

On the other hand, the storage nodes 16 and the source/ drain regions having low concentration impurities 7a are directly connected without imposing silicide layers between the storage node contacts 12b and the source/drain regions having low concentration impurities 7a. Accordingly, it is possible to restrict defective refresh of memory cell caused by a junction leak resulted from inadequate mohology in a silicide layer.

EXAMPLE 3

In the above Example 2, it is described that the surfaces of gate electrodes 6 composing the DRAM memory cell and the surface of source/drain region connected to the bit wire 15 are selectively silicided, and the surfaces of source/drain regions connected to the storage nodes 16 are connected directly to the storage node contacts 12b without siliciding.

A semiconductor device according to Example 3 has a structure that silicide layers 20, 21 and 21a exist on surfaces of gate electrodes 6 composing a DRAM memory cell and regions where a bit wire contact 12a and storage node contacts 12b are in contact with a semiconductor substrate 3, and silicide layers are not formed in boundaries between an activation region having the memory cell and non-active areas, namely portions where bird's beaks 4a are formed at end portions of separation oxide films 4. Numerals 10c designate non-silicide regions 1, which are TEOS oxide films laminated on regions near the bird's beaks.

Figure 5:
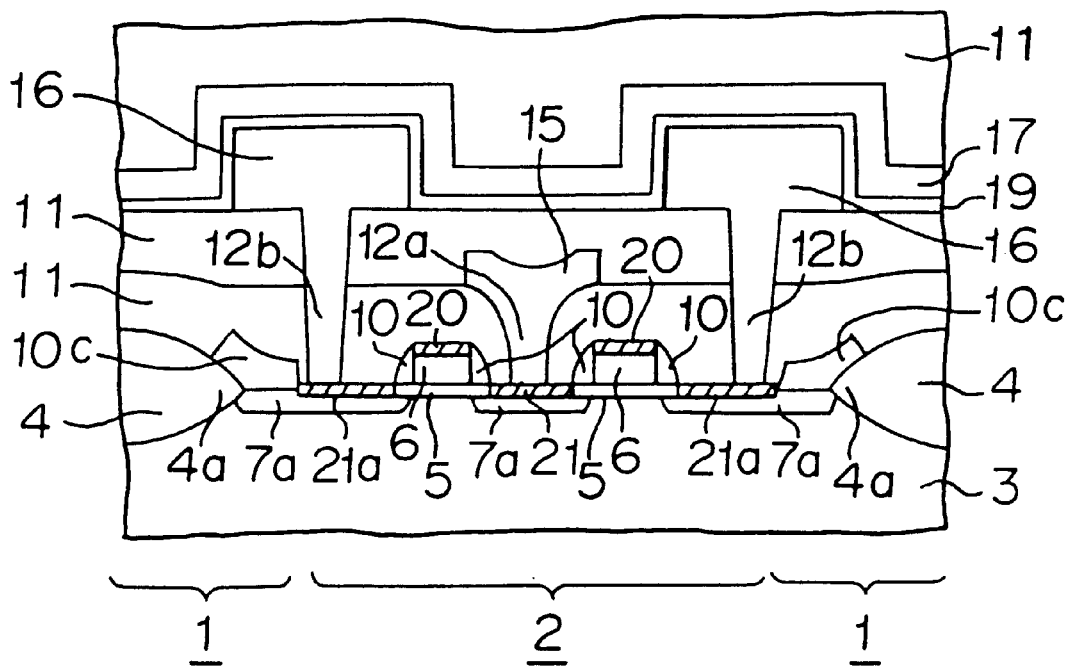
FIG. 5 is a side view of an important portion in cross-section of a semiconductor device for schematically showing Example 3 of the present invention.

In the memory cell region of the semiconductor device shown in FIG. 5, regions near the bird's beaks positioned at the end portions of separation oxide films 4 including portions of the regions having low concentration impurities 7a, which are connected to the storage node contacts 12b are the non-silicide regions 1 and the rest of memory cell regions is the silicide region 2. Hereinbelow, effects of the case that the non-silicide regions 1 and the silicide region 2 are constituted as such are described in comparison with the case that the whole surface of the memory cell region is made to be the silicide region.

Figure 6:
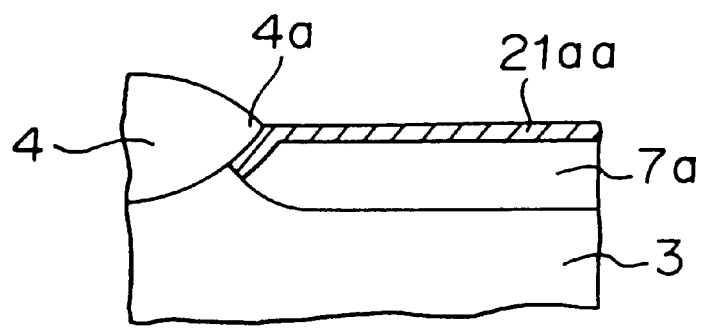
FIG. 6 is a cross-sectional view of a part of a semiconductor device for schematically showing Example 3 of the present invention.

In FIG. 6, a structure around the bird's beaks 4a are shown in section in the case that the whole surface of memory cell region is silicided. When a silicide layer 21aa was formed on a surface of region having low concentration impurities by siliciding, if the temperature of RTA was increased, the silicide layer 21aa was formed in a lower portion of the bird's beak 4a, whereby a junction leak from an edge of the region having low concentration impurities 7a was occasionally increased.

On the contrary, the semiconductor device according to Example 3 of the present invention is to prevent siliciding of the portions of the surfaces of regions having low concentration impurities 7a near the bird's beaks 4a by selectively leaving the TEOS oxide films 10c, which is laminated for depositing at sides of the gate electrodes 6, in the vicinity of the bird's beaks 4a in order to serve it as masks against siliciding. Simultaneously, low resistance of contact is obtainable by selectively siliciding the areas in contact with the storage node contacts 12b to form the silicide layers 21a.

By such a structure, it is possible to obtain the semiconductor device which can restrict the junction leak and attain a high-speed reading and a high-speed writing operation. Further, although only about the memory cell region, there was described, it is needless to say that it is also possible to apply siliciding in consideration of characteristics of a semiconductor device in a peripheral region and a logic circuit region.

Further, with respect to a method of producing the same, it is possible to form the side walls 10, which is formed by depositing on the sides of gate electrodes 6, and the TEOS oxide films 10c can be separately formed, as shown in Example 2.

EXAMPLE 4

Figure 7:
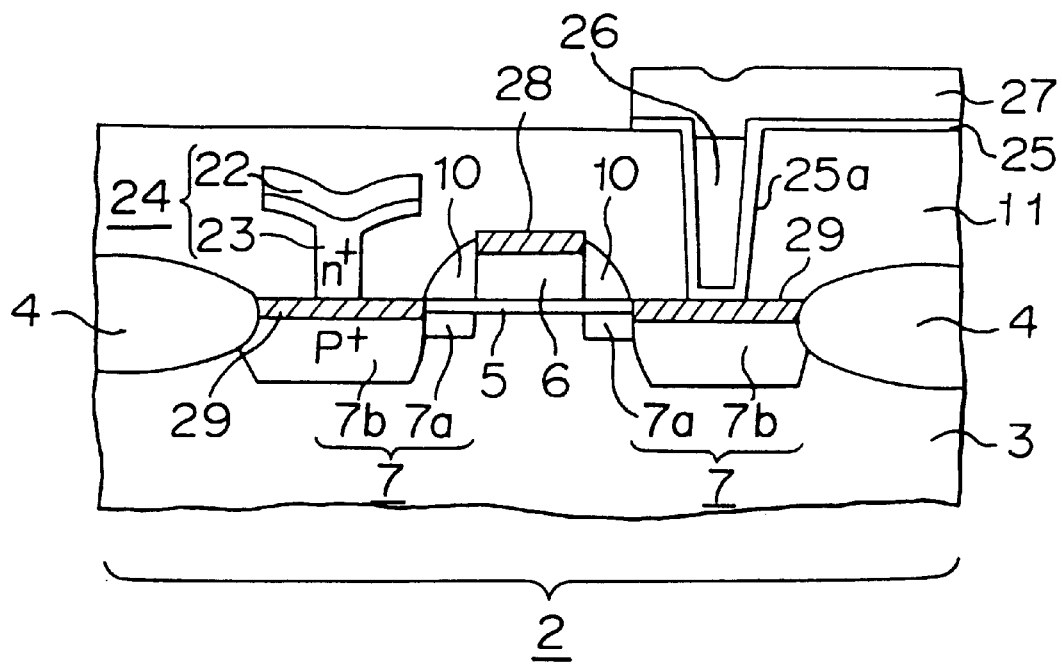
FIG. 7 is a side view of an important portion in cross-section of a semiconductor device for schematically showing Example 4 of the present invention.
Figure 8:
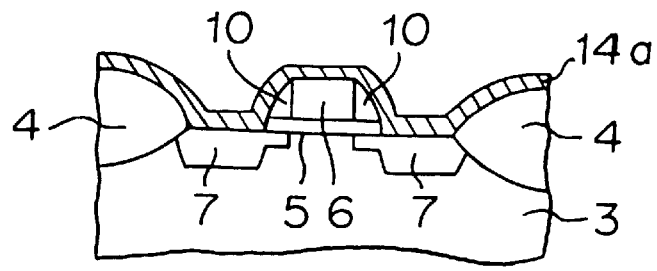
FIG. 8a through 8d are flow diagrams of production for schematically showing a cross-sectional view of a semiconductor device in Example 4 of the present invention.
Figure 8:
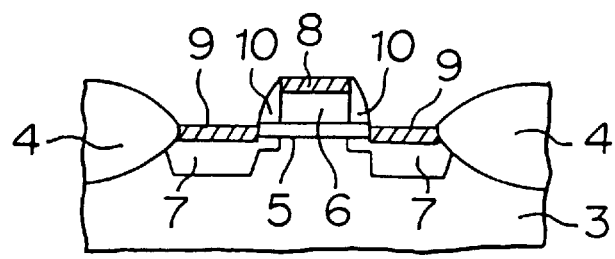
Figure 8:
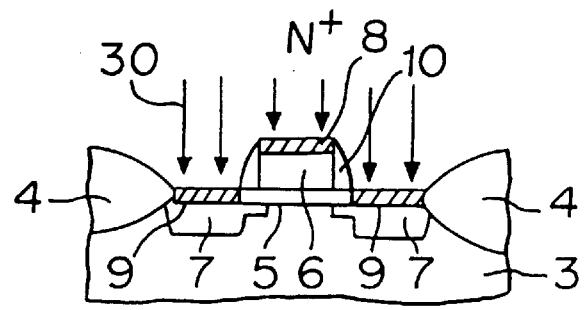
Figure 8:
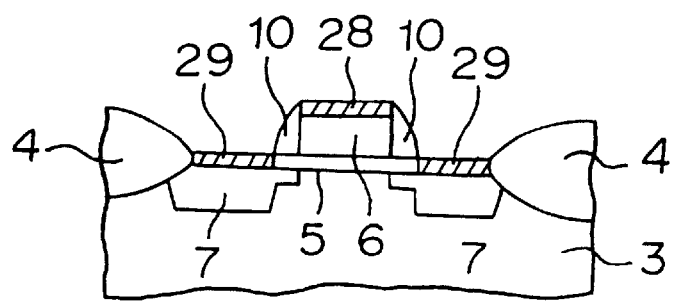

FIG. 7 is a cross-sectional view for showing, for example, a peripheral circuit region of DRAM, wherein numeral 24 designates a bit wire composed of a tungsten silicide 22 and a doped polysilicone 23 (in this Example, a part of the doped polysilicone 23 is constituting a bit wire contact), which bit wire 24 is formed in contact with silicide layer 29 formed on a surface of one of source/drain regions 7 of a MOS transistor. Numeral 25 designates a barrier metal laminated on the inner wall of a contact hole 25a so as to be in contact with a silicide layer 29 on the other source/drain region 7. Numeral 26 is a tungsten plug for filling in the inside of the contact hole 25a therewith, which is laminated on a surface of the barrier metal 25. Numeral 27 designates a first aluminum wiring electrically connected to the other source/ drain region 7 interposing the tungsten plug 26. On a surface of a gate electrode 6, a silicide layer 28 is formed.

The semiconductor device according to Example 4 has a feature that a region having high concentration p-type impurities 7b and the doped polysilicone 23 including high concentration n-type impurities are connected interposing the silicide layer 29.

In a conventional semiconductor device, which is commonly used, there was a problem that a contact having an ohmic property is not obtainable because a PN junction is formed by directly connecting the region having high concentration p-type impurities 7b and the doped polysilicone 23 including high concentration n-type impurities in a region of PMOS transistor of the peripheral circuit region.

Incidentally, when the MOS transistor composing the memory cell is an nMOS transistor, a conductive material of n-type doped polysilicone is generally used for constituting a bit wire contact, which is directly in contact with an n-type impurity region. This was because the diameter of contact hole in which the bit wire contact was embedded was very small, thereby it was difficult to stably embed by a chemical vapor deposition (CVD) of a group of metals. For this, polysilicone was used and the n-type impurities were doped therein because a conductive material including p-type impurities forms a PN junction.

However, when a bit wire contact is necessary to be formed in an area for forming PMOS transistors in a peripheral region, which is other than a memory cell region, if an n-type doped polysilicone and an p-type impurity region are directly connected, an ohmic property was not obtainable because a PN junction is formed.

Therefore, as shown in FIG. 7 of Example 4 of the present invention, the silicide layer 29 is interposed between two conductive materials respectively including different conductive type impurities to thereby obtain a good electrical connection without forming a PN junction.

In the next, a method of producing the semiconductor device shown in FIG. 7 is described. As shown in FIG. 8a, a PMOS transistor is formed on an n-well region provided in a surface of semiconductor substrate 3 in the peripheral region, and further a refractory metal or a near-noble metal such as a Ti film 14a is formed by a sputtering method.

As shown in FIG. 8b, a RTA treatment is performed for about 60 seconds under a nitrogen atmosphere and a temperature of 650° C. through 750° C., whereby a surface of gate electrode 6 and a surface of source/drain regions 7 are silicided to obtain the silicide layers 8 and 9. Thereafter, a part of Ti film 14a including TiN which was not silicided is removed.

As shown in FIG. 8c, nitrogen 30 is injected into at least surfaces of silicide layers 8 and 9 under a condition of $1 \times 10^{15}$ ions/cm$^2$ through $1 \times 10^{16}$ ions/cm$^2$ and 7 keV through 20 keV.

As shown in FIG. 8d, a treatment of plasma nitriding is conducted, the second RTA is conducted for about 60 seconds under a nitrogen atmosphere and the temperature of 800° C. or more to obtain silicide layers 28 and 29 having nitrogen in the upper layers thereof.

Figure 9:
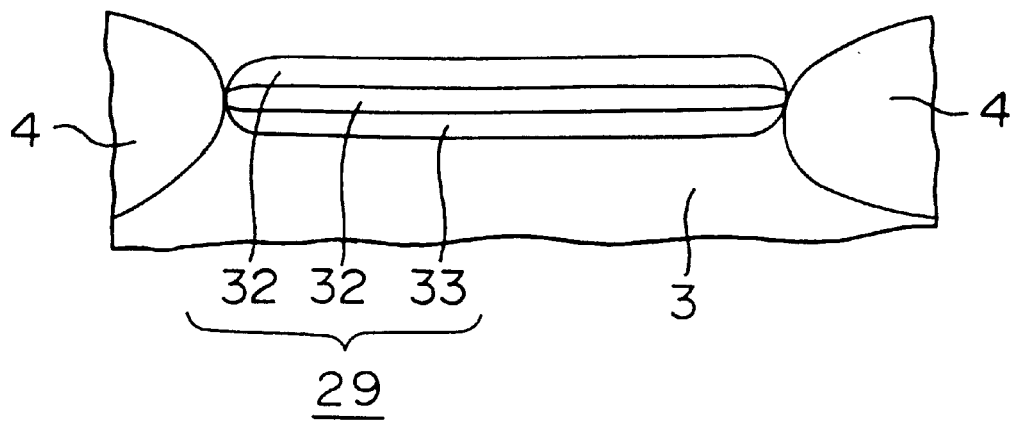
FIG. 9 is a cross-sectional view of a part of a semiconductor device for schematically showing Example 4 of the present invention.

FIG. 9 is an enlarged view for showing the silicide layer 29 containing nitrogen in the upper layers thereof, wherein the silicide layer 28 has the same structure. As shown in FIG. 9, the silicide layer 29 is so formed that the upper face is made of $Ti_{x1}Si_{y1}N_{z1}$31 containing many nitrogen atoms, the layer under this $Ti_{x1}Si_{y1}N_{z1}$31 is made of $Ti_{x2}Si_{y2}N_{z2}$32 containing many silicone atoms, and the layer under $Ti_{x2}Si_{y2}N_{z2}$32 is made of substantially pure $TiSi_2$33. There is shown as if the silicide layer 29 is made of three layers so that distribution of nitrogen atoms and distribution of silicone atoms can easily be understood. However, it is also possible to determine the structure of the silicide layer so that it has more layers by providing boundaries between $Ti_{x1}Si_{y1}N_{z1}$31, $Ti_{x2}Si_{y2}N_{z2}$32 and $TiSi_2$33 or less layers.

By forming the silicide layer 29 having a structure as in FIG. 9 and thereafter forming the bit wire contact of doped polysilicone 23 including n-type high concentration impurities so as to be in contact with the surface of silicide layer 29, it is possible to obtain a good electrical connection without the PN junction between the source/drain region 7 of the p-type impurities region and the bit wire contact.

Further, $Ti_{x1}Si_{y1}N_{z1}$(i.e. mixing layer) 31 in the surface of silicide layer 29 including many nitrogen atoms has a property close to that of pure TiN, wherein the layer 31 works as a barrier layer against impurities and restricts diffusion of n-type impurities contained in the bit wire contact of doped polysilicone 23 to the source/drain region 7. Accordingly, it is possible to obtain a semiconductor device having a better electrical property than when conductive materials of different conductive types are electrically connected interposing a silicide layer of only $TiSi_2$ without the barrier layer against impurities.

Also, the second RTA can be conducted if necessary. It is also possible to omit a step of plasma nitriding treatment after nitrogen is injected depending on conditions of the second RTA.

Further, although in this Example the Ti film 14a of a refractory metal or a near-noble metal is formed, it is needless to say that tungsten, cobalt, nickel and so on can be used for the Ti film.

EXAMPLE 5

Figure 10:
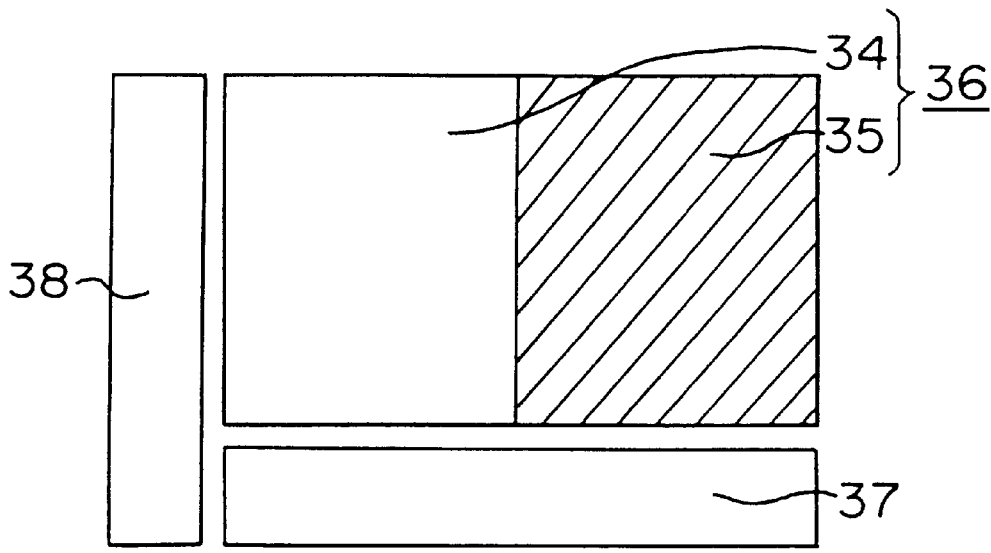
FIG. 10 is a plan view of a semiconductor device for schematically showing Example 5 of the present invention.

FIG. 10 is a schematical view for showing a structure of device and a pattern layout of a semiconductor device according to Example 5.

In Example 5, a non-silicide region 34 and a silicide region 35 are provided in a DRAM memory cell region 36. In FIG. 10, numeral 37 designates a peripheral circuit for columns such as a column decoder, a sense amplifier and a light buffer; and numeral 38 designates a peripheral circuit for rows such as a row decoder.

To the silicide region 35, it is possible to apply the memory cell structure which is silicided as shown in Example 2 or Example 3.

By providing both the non-silicide region 34 and the silicide region 35 in the DRAM memory cell region 36 of the identical chip, memory cells having excellent refresh properties and memory cells which enable a high-speed access are obtainable simultaneously. By using the so constructed DRAM memory cell, an address is determined to designate a memory cell in the silicide region 35 for a circuit having a short margin in an access time, whereby a long margin in respect of the circuit operation can be kept without changing the structure of peripheral circuit.

EXAMPLE 6

Figure 11:
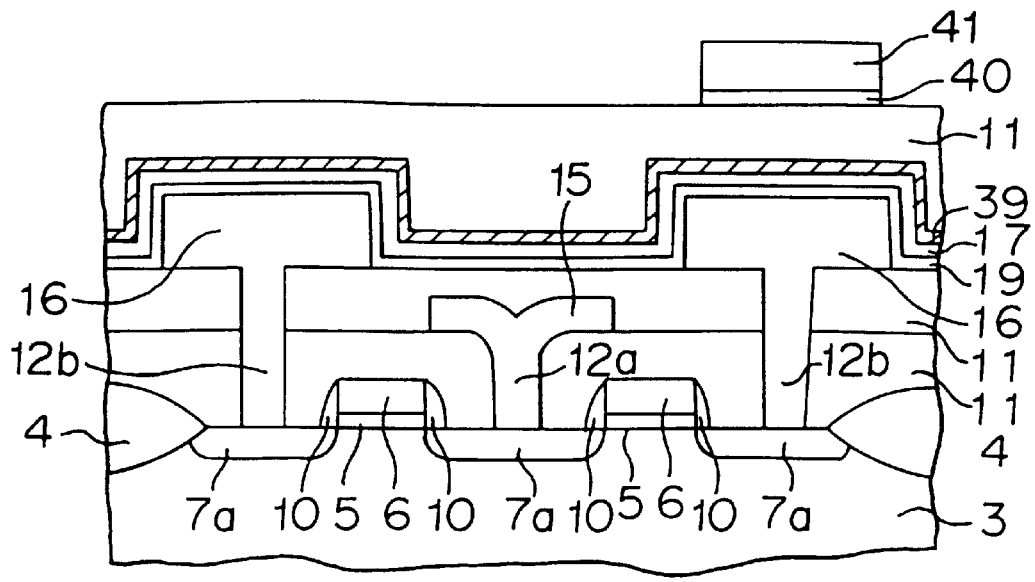
FIG. 11 is a side view of an important portion in cross-section of a semiconductor device for schematically showing Example 6 of the present invention.

Example 6 of the present invention will be described in detail in reference of FIG. 11 showing the structure thereof.

In Examples 1 through 5, MOS transistors in the semiconductor device are selectively silicided to improve electrical characteristics, specifically to obtain a high-speed operation while keeping a sensitive operation of the memory cell.

A semiconductor device according to Example 6 also has a feature that electrical characteristics of the semiconductor device to be obtained by selectively siliciding the semiconductor device. However, more specifically, it is characterized by that a coupling noise caused between a cell plate 17 and a first aluminum wiring 41 along with a change of electric potential of a first aluminum wiring 41 located in an upper portion of the device interposing an inter-layer insulating film 11, can be restricted by laminating a silicide layer 39 on the surface of cell plate 17 in a memory cell region.

In FIG. 11, numeral 39 designates the silicide layer laminated on the cell plate 17; numeral 40 designates a barrier metal laminated on the silicide layer 39 interposing the inter-layer insulating film 11; and numeral 41 designates the first aluminum wiring patterned on the inter-layer insulating film 11 interposing the barrier metal 40.

In the next, an operation of a semiconductor device, when such silicide layer 39 is not formed, will be described. In general, a cell plate 17 is used by fixing on a voltage of ½ Vcc. When the first aluminum wiring 41 is arranged just above a storage node 16 or in the vicinity thereof, if electrical potential of the first aluminum wiring is changed from H to L or from L to H, a change of electric charges (i.e. electric potential) in the storage node may have been derived by a change of coupling capacity between the first aluminum wiring 41 and the cell plate 17. Specifically, when the cell plate 17 was formed by a material having a relatively high resistance such as doped polysilicone, there was a problem that the storage node 16 was adversely effected by the coupling noise.

Therefore, the semiconductor device shown in FIG. 11 is provided to cover the surface of cell plate 17 by the silicide layer 39 having a low resistance, whereby the impedance can be restricted to be small. By such a structure, it is possible to lead a coupling noise to an outer aluminum wiring having an electric potential of ½ Vcc easily when the coupling noise is derived by a change of electric potential in the first aluminum wiring 41, whereby the noise is prevented from adversely effecting the storage node 16.

Also, the effect of restricting coupling noise becomes large by making the silicide layer 39 using a silicide having a lower resistance such as $TiSi_2$. The silicide layer 39 of the semiconductor device according to Example 6 can be a layer formed by siliciding a refractory metal or a near-noble metal under a predetermined atmosphere by a RTA after laminating the refractory metal or the near-noble metal such as Ti on the surface of polysilicone or a layer formed by sputtering after forming the cell plate 17. Further, the silicide layer 39 can be formed after whichever steps of just after laminating a polysilicone film which will be cell plate 17 or after patterning the cell plate 17 by etching.

EXAMPLE 7

A semiconductor device according to Example 7 will be described in reference of FIG. 12.

The structure of semiconductor device of Example 7 corresponds to another cross-section of the semiconductor device shown in FIG. 11 according to Example 6, wherein a first aluminum wiring 40*a* is in contact with a silicide layer 39*a* covering the surface of cell plate 17 interposing a contact 41*aa*, and another first aluminum wiring 41*b* is connected to a region including low concentration impurities 7*a* formed on a surface region of a semiconductor substrate 3 interposing a contact 41*bb*. In this case, the silicide layer 39*a* is characteristically made of a silicide of a material having a higher selection ratio than that of doped polysilicone constituting the cell plate 17, for example, a tungsten silicide.

Figure 12:
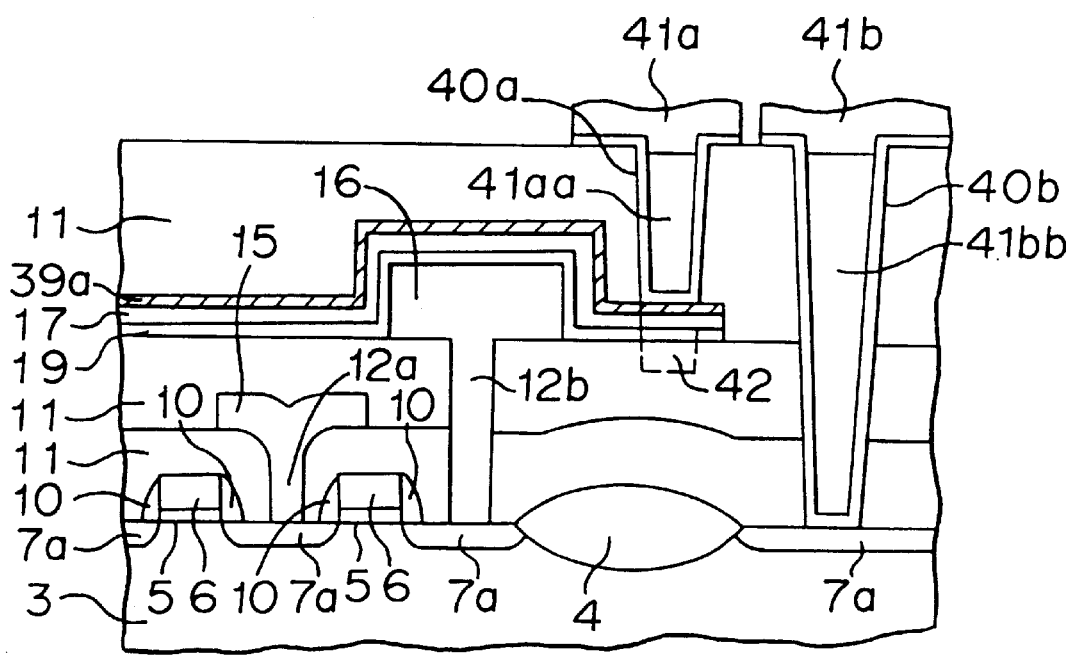
FIG. 12 is a side view of an important portion in cross-section of a semiconductor device for schematically showing Example 7 of the present invention.
Figure 13:
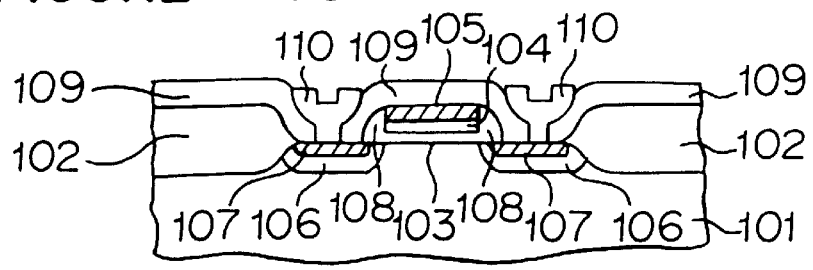
FIG. 13 is a side view in cross-section for schematically showing a conventional semiconductor device.
Figure 14:
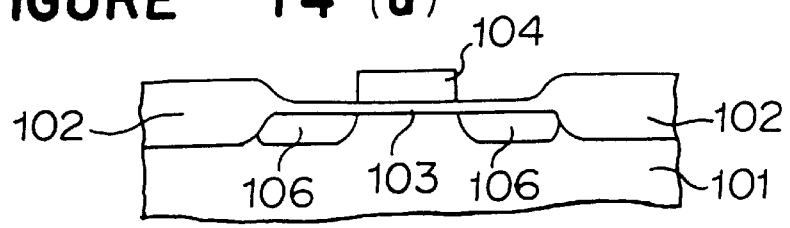
FIG. 14 is a flow diagram of production for schematically showing a cross-sectional view of a conventional device.
Figure 14:
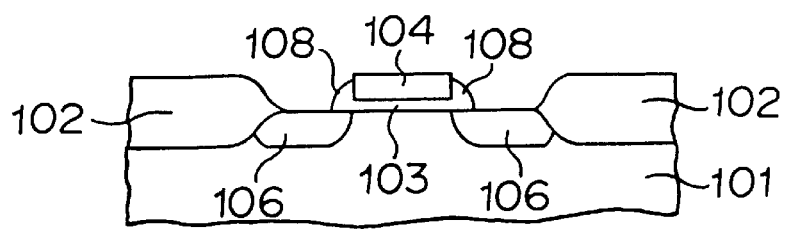
Figure 14:
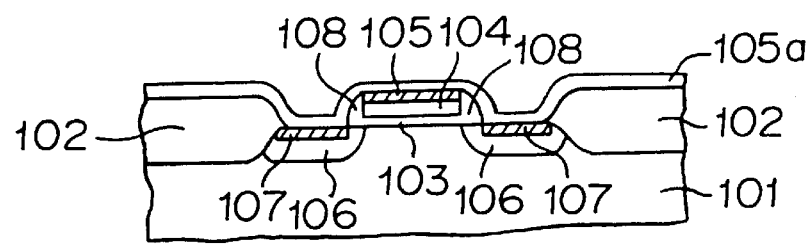
Figure 14:
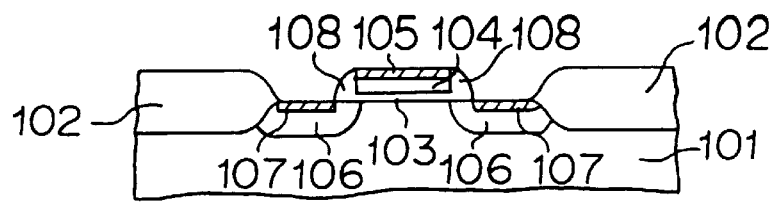

As shown in FIG. 12, a distance from a starting position of forming the first aluminum wiring 41*a* to silicide layer 39*a* and a distance from a starting position of forming the aluminum wiring 41*b* to a surface of a semiconductor substrate 3 are largely different. In a case that the silicide layer 39*a* is not formed, when contact holes for embedding the contacts 4*aa* and 41*bb* are processed simultaneously, the contact hole for embedding the contact 41*aa* is apt to protrude the cell plate 17*a* and a dielectric film 19 both composing a capacitor to be in section that the opening arrives at a lower portion thereof. In a case that such a protruding portion 42 was formed, when a conductive material is embedded therein to form the contact 41*aa*, there was a problem that the resistance of contact was not stable because an area in contact with the contact was changed and a stable electric characteristics were not obtainable.

Accordingly, in this example of the present invention, it is constructed such that an etching mask is formed by laminating the silicide layer 39*a* having a higher selection ratio than that of the cell plate 17 on a surface of the cell plate 17, and therefore contact holes protruding the capacitor electrode are not formed even when the contact holes having different depths are opened simultaneously. Thus, the silicide layer 39*a* laminated on the cell plate 17 attains not only a low resistance of the cell plate 17 but also a good electrical connection between the cell plate 17 and the first aluminum wiring 41*a*.

Hereinbelow, effects of the present invention will be described.

The semiconductor device according to the first aspect of the present invention provides a good circuit operation without a junction leak in a non-silicide region and a high-speed operation in a silicide region because the semiconductor device is constructed such that the portion of memory cell is the non-silicide region, the peripheral circuit region or the logic circuit region including the peripheral circuit region, which are regions other than the memory cell region, is non-silicide region; and a silicide layer is formed on surfaces of gate electrodes and surfaces of source/drain regions of transistors to reduce wiring resistance and contact resistance.

The semiconductor device according to the second aspect of the present invention provides good electric characteristics by constituting the semiconductor device such that silicide layers are selectively formed on gate electrodes and surfaces of source/drain regions, which are in contact with the bit wire contact, of transistors composing the DRAM memory cell to reduce the resistance; and source/drain regions, which are in contact with the storage nodes, are not silicided to restrict a defective refresh by a junction leak caused by improper mohology of the silicide layer.

The semiconductor device according to the third aspect of the present invention provides restriction of a junction leak caused by the siliciding and low resistance of contacts between storage nodes and source/drain regions by constituting such that silicide layers are formed selectively on portions in contact with the storage nodes in surfaces of the source/drain regions to which the storage nodes are connected and the other regions, namely the peripheral regions of the source/drain regions are not silicided.

The semiconductor device according to the fourth aspect of the present invention provides good electric characteristics by constituting such that the impurity regions and the contacts, respectively including impurities of different conductive types, are connected to interposing silicide layers so as not to form a PN junction; and the surfaces of silicide layers have a property close to that of pure TiN including many nitrogen atoms to serve as an impurity barrier layers to restrict diffusion of the impurities.

The semiconductor device according to the fifth aspect of the present invention provides good electric characteristics by constituting such that a wiring made of semiconductor material including second conductive type impurities, which can be connected directly to a source/drain region of the second conductive type of second conductive type transistor in a memory cell region, can be electrically connected to an impurity region of the first conductive type, which composes a peripheral circuit region interposing a silicide layer in order to restrict diffusion of the impurities.

The semiconductor device according to the sixth aspect of the present invention provides both functions of enabling a high-speed operation and improving properties of refresh so that these functions can be selected as required by constituting such that the memory cell region is composed of a silicide region and a non-silicide region in order to realize a region for a high-speed operation and a region for improving the properties of refresh in one chip.

The semiconductor device according to the seventh aspect of the invention provides good electric characteristics by constituting such that a silicide layer is deposited on an upper electrode of capacitor composing the memory cell to obtain a low resistance and thereby to reduce influences of coupling noise between the upper electrode and a wiring in an upper layer, formed on the upper portion of the capacitor interposing an inter-layer insulating film.

The semiconductor device according to the eighth aspect of the present invention provides good electric characteristics by constituting such that a silicide layer formed on an upper electrode of capacitor is made of a material having a high selection ratio than that of doped polysilicone so as to restrict an excessive etching to the capacitor when an opening portion for embedding a contact is processed, which contact is necessary to electrically connecting a wiring in an upper layer and an electrode of capacitor.

The method of producing the semiconductor device according to the ninth aspect of the present invention provides side walls in a second region also serve as masks against injecting impurities when a region having high concentration impurities is formed in a succeeding step and an insulating material laminated in a first region as a film for preventing from siliciding in a siliciding step by constituting such that the insulating material in the first region of a memory cell region laminated after gate electrodes are formed is left as is laminated and the insulating material in the second region of a peripheral circuit region or a logic circuit region including said peripheral circuit region is rendered to be the side walls deposited on sides of the gate electrodes by an anisotropic etching.

The method of producing the semiconductor device according to the tenth aspect of the present invention provides good electric characteristics by constituting such that surfaces of silicide layers are changed to have properties like pure TiN including many nitrogen atoms by injecting nitrogen into said silicide layers to obtain films having properties like TiN as a barrier layer against impurities for restricting diffusion of the impurities.

What is claimed is:

1. A semiconductor device comprising:

a DRAM memory cell region, and a peripheral circuit region or a logic circuit region including said peripheral circuit region, characterized by:

a first MOS transistor in said peripheral circuit region or said logic circuit region has silicide layers respectively on a first gate electrode, in which sides side walls are deposited, and on first source/drain regions; and a second MOS transistor composing a memory cell in said DRAM memory cell region is formed such that the same material as that constituting said side walls is laminated on a second gate electrode and second source/drain regions of the second MOS transistor.

2. A semiconductor device according to claim 1, further comprising:

a first conductive type impurity region formed in a surface region of a semiconductor substrate, and a contact made of a semiconductor material including a second conductive type impurities, which is connected to a surface of said first conductive type impurity region interposing the silicide layer, wherein said silicide layer has a multi-layer structure including at least a first silicide layer including and a second silicide layer positioned below said first silicide layer; and the concentration of nitrogen of a portion in said first silicide layer is large as the portion is close to said contact, and the concentration is small as the portion is close to said second silicide layer.

3. A semiconductor device according to claim 2, wherein the first conductive type impurity region is in the first source/drain regions of the first transistor composing the peripheral circuit;

both or one of said first source/drain regions are electrically connected to both or one of the second source/drain regions of the second transistor composing the memory cell region; and the second source/drains regions include the second conductive type impurity region.

4. A semiconductor device comprising:

a DRAM memory cell region; and a peripheral circuit region or a logic circuit region including said peripheral circuit region, characterized by said DRAM memory cell region comprises: MOS transistors in a semiconductor substrate, storage nodes electrically connected to one of source/drain regions of said MOS transistors, a cell plate laminated on surfaces of said storage nodes interposing a dielectric film, and silicide layers formed on surface of the other source/drain region, which is in contact with a bit wire contact.

5. A semiconductor device according to claim 4, wherein the DRAM memory cell region comprises a first region including a memory cell having a silicide layer at least in a part thereof and a second region including a memory cell without any silicide layer.

6. A semiconductor device according to claim 4, wherein storage node contacts are connected to the source/drain regions, which regions are other than that in contact with the bit wire contact; and the silicide layers are selectively formed in a portion for connecting to the storage nodes on surfaces of said source/drain regions.

7. A semiconductor device according to claim 6, wherein the DRAM memory cell region comprises a first region including a memory cell having a silicide layer at least in a part thereof and a second region including a memory cell without any silicide layer.

8. A semiconductor device comprising:

a MOS transistor formed in a DRAM memory cell region 1 of a semiconductor substrate, storage nodes electrically connected to one of source/drain regions of the semiconductor, and a cell plate laminated on a surface of the storage node interposing a dielectric film, characterized by a silicide layer is laminated on a surface of the cell plate; and an upper wiring is formed on the silicide layer interposing an inter-layer insulating film.

9. A semiconductor device according to claim 8, wherein an upper wiring is electrically connected to a silicide layer interposing a contact formed in the inter-layer insulating film.

10. A method of producing a semiconductor device comprising:

a step of forming gate electrodes on surfaces of a first region and a second region of the semiconductor substrate respectively interposing gate insulating films, a step of forming a pair of regions including low concentration impurities interposing channel regions located below the gate electrodes respectively in the first region and the second region, a step of laminating insulating material respectively on the first region and the second region, a step of forming an etching mask on the first region, a step of forming side walls made of the insulating material to be deposited on sides of the gate electrode using an anisotropic etching in the second region, a step of forming regions having high concentration impurities by implanting impurities into the regions having low concentration impurities in the second region, a step of removing the etching mask, a step of laminating a film of a refractory metal or a film of a near-noble metal at least on the second region, a step of forming silicide layers at portions where the film of refractory metal or the film of near-noble metal are in contact with the gate electrode and the source/drain regions of the second region by heating for siliciding, and a step of removing unreacted portions of the film of refractory metal or the film of near-noble metal, characterized by that the first region is a DRAM memory cell region and the second region is a peripheral circuit region or a logic circuit region including the peripheral circuit region.

11. A method of producing a semiconductor device according to claim 10, further comprising:

a step of implanting nitrogen into said silicide layers, a step of providing heat treatment, a step of forming a contact having a different conductivity from the region of impurities and being in contact with the silicide layer, characterized by the silicide layer implanted nitrogen has a multilayer structure including at least a first silicide layer including nitrogen atoms and being in contact with the contact and a second silicide layer positioned below the first silicide layer;

the concentration of nitrogen at a portion in the first silicide layer is high as the portion is close to the contact; and the concentration of nitrogen at the portion is low as the portion is close to the second silicide layer.

* * * * *